(12) United States Patent
Pfeuffer

(10) Patent No.: US 10,741,723 B2
(45) Date of Patent: Aug. 11, 2020

(54) COMPONENT WITH GEOMETRICALLY ADAPTED CONTACT STRUCTURE AND METHOD FOR PRODUCING THE SAME

(71) Applicant: OSRAM Opto Semiconductors GmbH, Regensburg (DE)

(72) Inventor: Alexander F. Pfeuffer, Regensburg (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

(21) Appl. No.: 16/317,472

(22) PCT Filed: Jul. 13, 2017

(86) PCT No.: PCT/EP2017/067695
§ 371 (c)(1),
(2) Date: Jan. 11, 2019

(87) PCT Pub. No.: WO2018/015264
PCT Pub. Date: Jan. 25, 2018

(65) Prior Publication Data
US 2019/0245114 A1   Aug. 8, 2019

(30) Foreign Application Priority Data
Jul. 18, 2016   (DE) ................... 10 2016 113 193

(51) Int. Cl.
*H01L 33/38* (2010.01)
*H01L 23/00* (2006.01)
(Continued)

(52) U.S. Cl.
CPC ............ *H01L 33/382* (2013.01); *H01L 24/13* (2013.01); *H01L 24/14* (2013.01); *H01L 24/16* (2013.01);
(Continued)

(58) Field of Classification Search
CPC ......... H01L 33/08; H01L 33/24; H01L 33/62; H01L 33/382; H01L 33/387; H01L 2933/0066; H01L 23/481
See application file for complete search history.

(56) References Cited

U.S. PATENT DOCUMENTS 9,899,418 B2    2/2018  Pfeuffer et al.
2009/0001490 A1*  1/2009  Bogner .............. H01L 25/0753
                                                257/432
(Continued)

FOREIGN PATENT DOCUMENTS

DE   102012112302 A1   6/2014
JP   2003031895 A      1/2003
WO   2016193071 A1     12/2016

*Primary Examiner* — Matthew L Reames
*Assistant Examiner* — John A Bodnar
(74) *Attorney, Agent, or Firm* — Slater Matsil, LLP

(57) ABSTRACT

A component with an geometrically adapted contact structure and a method for producing such a component are disclosed. In an embodiment a component includes a contact structure including a contiguous contact layer having a plurality of openings and being assigned to a first electrical polarity of the component and a plurality of individual contacts at least in part having different vertical heights, wherein the contacts extend in the openings throughout the contiguous contact layer, wherein the contacts are laterally spaced from each other and assigned to a second electrical polarity of the component, and wherein the contacts are arranged with respect to their different heights and their positions such that a height distribution of the contacts is adapted to a predetermined geometrically non-planar contour profile.

20 Claims, 8 Drawing Sheets

(51) Int. Cl.
*H01L 33/24* (2010.01)
*H01L 33/08* (2010.01)
*H01L 33/20* (2010.01)

(52) U.S. Cl.
CPC ............. *H01L 24/17* (2013.01); *H01L 24/81* (2013.01); *H01L 33/08* (2013.01); *H01L 33/20* (2013.01); *H01L 33/24* (2013.01); *H01L 33/387* (2013.01); *H01L 2224/0401* (2013.01); *H01L 2224/05624* (2013.01); *H01L 2224/05639* (2013.01); *H01L 2224/06102* (2013.01); *H01L 2224/13007* (2013.01); *H01L 2224/13019* (2013.01); *H01L 2224/13021* (2013.01); *H01L 2224/13022* (2013.01); *H01L 2224/13023* (2013.01); *H01L 2224/141* (2013.01); *H01L 2224/1403* (2013.01); *H01L 2224/14051* (2013.01); *H01L 2224/14104* (2013.01); *H01L 2224/16111* (2013.01); *H01L 2224/16147* (2013.01); *H01L 2224/16148* (2013.01); *H01L 2224/171* (2013.01); *H01L 2224/81193* (2013.01); *H01L 2224/81815* (2013.01)

(56) References Cited

U.S. PATENT DOCUMENTS

| | | | |
|---|---|---|---|
| 2011/0073900 A1* | 3/2011 | Sugizaki | H01L 24/02 257/99 |
| 2011/0300651 A1 | 12/2011 | Kojima et al. | |
| 2012/0032145 A1* | 2/2012 | Nagai | H01L 24/11 257/14 |
| 2012/0145994 A1* | 6/2012 | Adivarahan | H01L 21/0237 257/13 |
| 2014/0077246 A1* | 3/2014 | Bhat | H01L 33/0079 257/98 |
| 2015/0097286 A1 | 4/2015 | Suen et al. | |
| 2015/0108526 A1 | 4/2015 | Tsai et al. | |
| 2015/0325598 A1* | 11/2015 | Pfeuffer | H01L 25/167 257/59 |
| 2018/0151548 A1 | 5/2018 | Pfeuffer et al. | |

* cited by examiner

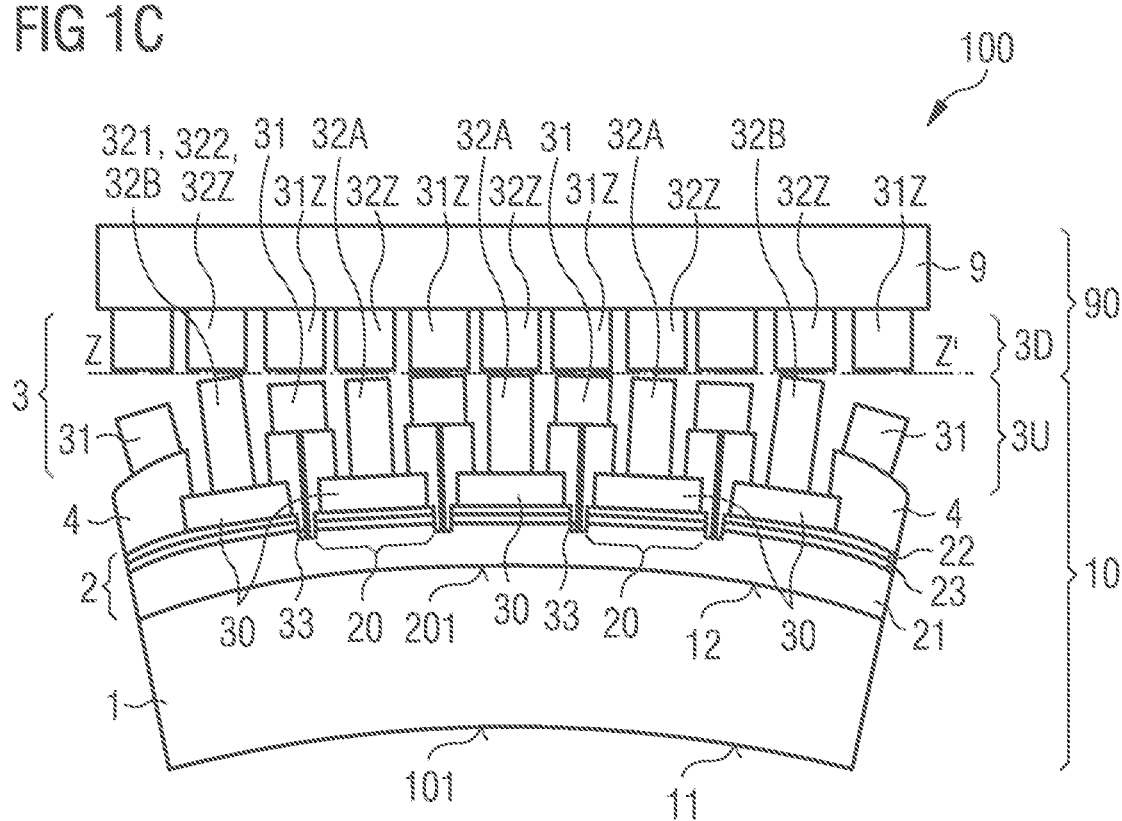
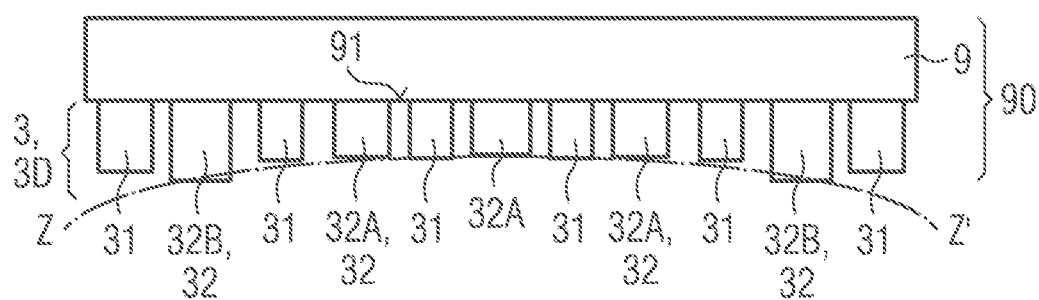

COMPONENT WITH GEOMETRICALLY ADAPTED CONTACT STRUCTURE AND METHOD FOR PRODUCING THE SAME

This patent application is a national phase filing under section 371 of PCT/EP2017/067695, filed Jul. 13, 2017, which claims the priority of German patent application 102016113193.8, filed Jul. 18, 2016, each of which is incorporated herein by reference in its entirety.

TECHNICAL FIELD

A component with a geometrically adapted contact structure is specified. Furthermore, a method for producing a component with a geometrically adapted contact structure is specified.

BACKGROUND

In the case of hetero-integration of components, in particular with a plurality of light dots, a reliable connection of the light dots to a driver circuit is necessary. Thermomechanical tension between different functional levels of the component often leads to undesired deformations—also known as "bowling"—resulting in an unreliable connection, such as an unreliable solder connection, between the components. The deformations can be grinded flat, but there is a great risk that the components will be damaged. This issue concerning tensions can also be addressed by adjusting the coefficients of expansion of the layers located at a connection plane or by applying layers with suitable counter-tensioning. However, such methods prove to be costly and often not sufficiently reliable.

SUMMARY OF THE INVENTION

Embodiments provide a component with a geometrically adapted contact structure that allows a simplified and reliable mechanical connection to another component. Further embodiments provide a simplified method for producing such a component.

In at least one exemplary embodiment of a component, it has a contact structure. The contact structure contains a contiguous contact layer which has a plurality of openings and is assigned to a first electrical polarity of the component. Furthermore, the contact structure has a plurality of individual contacts, at least in part with different vertical heights, wherein in the openings, the contacts extend throughout the contiguous contact layer. The individual contacts are assigned to a second electrical polarity of the component and in particular are laterally spaced from each other. The contacts can thus be individually electrically connected or individually electronically controllable. With regard to their different heights and positions, the contacts are arranged in such a way that a height distribution of the contacts is adapted to a predetermined geometrically non-planar contour profile, such as the contour profile of a curved surface. In particular, the component has a mounting surface which is defined by exposed surfaces of the contacts. The mounting surface of the component can be flat, especially planar, or curved.

The predetermined geometrically non-planar contour profile can be given by the contour profile of one layer of the component or by a mounting surface or by a connecting surface of a further component. The contacts having at least in part different vertical heights are adapted to a predetermined geometrically non-planar contour profile, such as to a contour profile having a non-planar, in particular curved surface if the contacts have ends whose surfaces define a contour profile which substantially reproduces the predetermined geometrically non-planar contour profile. Here, the ends of the contacts can face towards or face away from the mounting surface of the component. In particular, the one ends of the contacts define a flat surface, while the other opposite ends of the contacts define a non-planar, in particular curved, surface. By combining the heights of the contacts with their lateral positions, possible deformations of the component are compensated by the contour profile of the contacts. The height-compensation allows, for example, to better follow a given contour profile of a curved surface. The height-compensation also makes it possible for the component to have a mounting surface having the highest standards in terms of evenness. Thus, the height-compensation enables a more reliable connection, especially at the edge of the component, which results in a higher yield and more robust components.

According to at least one embodiment of the component, it has a semiconductor body. The semiconductor body comprises a first semiconductor layer of a first charge carrier type, a second semiconductor layer of a second charge carrier type and an active layer located therebetween. In particular, the active layer is configured for generating or detecting electromagnetic radiation in the visible, ultraviolet or in the infrared spectral range. In particular, the second semiconductor layer and the active layer are structured into a plurality of laterally spaced subregions of the semiconductor body. For example, the semiconductor body has at least 20, at least 50, at least 100 or at least 1000 such subregions. The subregions can be arranged in rows and columns and thus form a matrix arrangement of light-emitting pixels. Having such a semiconductor body, the component is formed in particular as a semiconductor structure or as an optoelectronic component.

In particular, the semiconductor body is segmented in such a way that the subregions of the semiconductor body can form luminous dots or light-emitting pixels of the component. The first semiconductor layer can also be segmented or non-segmented. In the latter case, the subregions can be arranged on the first semiconductor layer, wherein the subregions are spaced apart from each other in lateral directions and are mechanically connected to each other, for example, via the first semiconductor layer.

In particular, the subregions are formed in such a way that they can be electronically activated individually. The contacts are configured in particular for electrically contacting the subregions. Along its lateral main extension surface, the semiconductor body has a curvature which defines the predetermined geometrically non-planar contour profile. The semiconductor body may be arranged on a carrier or on a growth substrate, wherein the carrier or growth substrate has a surface facing the semiconductor body which may have the same curvature as the semiconductor body. The component can also be free of a growth substrate.

A lateral direction is generally understood to mean a direction which runs along, in particular parallel to a main extension surface of the component or semiconductor body. A vertical direction, on the other hand, is understood to mean a direction that is directed transverse, in particular perpendicular to the main extension surface of the component or of the semiconductor body. The vertical direction and the lateral direction are thus perpendicular to each other.

According to at least one embodiment of the component, the semiconductor body is arranged on a substrate. The first semiconductor layer is arranged in the vertical direction between the substrate and the subregions or the second semiconductor layer. The first semiconductor layer can be contiguous and coherent. The subregions may have a common first semiconductor layer. In the lateral direction, the subregions are electrically isolated from each other, for example, by an insulating layer, so that the subregions can be activated individually and thus independently from each other. The second semiconductor layer is arranged in particular between the contact layer and the first semiconductor layer. The contact structure preferably has a plurality of through-vias extending from the contact layer throughout both the second semiconductor layer and the active layer into the first semiconductor layer. The through-vias can be arranged laterally from the corresponding subregions. In particular, the subregions are separated from each other in lateral directions by separation trenches. The through-vias and/or the insulating layer may be located at least partially in areas of the trenches. Alternatively, it is possible that the subregions are defined solely by connection layers which are spaced apart from each other, wherein the connection layers are configured for electrically contacting a common semiconductor layer of the subregions. The common semiconductor layer can have a comparatively low electrical transverse conductivity, wherein a distance between adjacent connection layers is preferably chosen so large that the subregions can be electrically activated exclusively by their associated connection layers and not by adjacent connection layers.

According to at least one embodiment of the component, it comprises a driver element having a plurality of transistors and/or integrated circuits. The contacts are preferably electrically conductively connected to the driver element and can be electrically connected individually or electronically activated individually via the driver element. The component is formed in particular as a connection structure or as a driver structure, especially for a further component formed as a semiconductor structure.

According to at least one embodiment of the component, the contacts have exposed ends, wherein the exposed ends define a mounting surface of the component. The contacts are preferably formed in such a way that an average distance from the mounting surface to a connecting surface is less than 10 µm, in particular less than 6 µm or less than 3 µm. The connecting surface can be an ideal flat plane or a surface having the predetermined geometrically non-planar contour profile. The connecting surface, however, can be a mounting surface of a further component, wherein the further component is to be mechanically and electrically connected to the component described here.

According to at least one embodiment of the component, the contacts are assigned to at least a first group of contacts and a second group of contacts. The contacts of the first group each have a one-piece formed first section. The contacts of the second group each have a one-piece formed second section. In particular, the first sections of different contacts of the first group are of equivalent construction and have a first vertical layer thickness. The second sections of different contacts of the second group are particularly of equivalent construction and have a second vertical layer thickness. The first vertical layer thickness is preferably different from the second vertical layer thickness, so that the contacts of the first group and the contacts of the second group have different vertical heights. The first sections and the second sections can be produced in a common forming process or in different forming processes. In a forming process, for instance steps such as lithography, metallization and steps for removing lacquer are carried out.

A one-piece formed section is generally understood to mean a contiguous section that can be produced in a single process step. Thus, the one-piece formed section is for instance free of an inner connecting layer and preferably is made continuously of the same material.

According to at least one embodiment of the component, the contact structure has an insulating layer comprising a plurality of openings. In particular, the openings of the insulating layer correspond with the openings of the contact layer. In other words, the insulating layer and the contact layer may have common openings.

The contacts, in particular all contacts, of the contact structure each have a one-piece formed section. The one-piece formed sections of the contacts are located in particular in the corresponding openings of the insulating layer and in each case protrude vertically beyond the insulating layer in regions. Preferably, at least some of the one-piece formed sections have different vertical heights. In particular, the sections having lower vertical heights are formed in such a way that in a plan view, they are arranged within the corresponding openings of the insulating layer. For example, the sections having greater vertical heights are formed to completely fill the associated openings of the insulating layer and, in a plan view, have a larger cross-section than the associated openings of the insulating layer.

The sections having lower vertical heights and the sections having higher vertical heights can thus be produced in a common process step, such as in a single common forming process, wherein the sections having different heights can be produced by a single lithographic step and by a single deposition process. In particular, these sections may be made from the same material. For example, such sections are produced in a common deposition process. Since some of the sections completely fill the associated openings of the insulating layer and project laterally beyond the associated openings, during a common forming process, they can be made higher than the sections that do not completely fill the associated openings of the insulating layer and have a lateral distance to inner walls of the openings.

According to at least one embodiment of the component, at least some of the contacts have one or a plurality of spacer layers, wherein an adaptation of the height distribution of the contacts to a predetermined geometrically non-planar contour profile is realized by different numbers of the spacer layers of the respective contacts. In particular, the spacer layers can be arranged between the contact layer and the semiconductor body. With regard to etch selectivity, adhesion, reflectivity in the chip process, under certain circumstances, the spacer layers can be formed as functional layers, such as mirror layers and/or barrier layers, and at the same time as layers for height-compensation. Thus, possible additional effort for their implementation can be reduced. Using one spacer layer, two height levels can be generated for the contact structure, especially for the contacts. For instance, using two deposited spacer layers which are produced procedurally independently, up to four different height levels can be generated, in particular when the spacer layers are arranged one above the other in regions. The spacer layers are especially metallic and preferably comprise at least one metal or one metal alloy.

According to at least one embodiment of a device, it comprises a component described here. The contacts of the contact structure of the component or of the device can each be of multi-piece construction and each have a first partial region and a second partial region. The first partial region and the second partial region of the respective contacts can be mechanically and electrically connected by a connecting material. For example, the first partial regions of the contacts are arranged between the semiconductor body and the second partial regions of the contacts. In particular, the device is an optoelectronic device.

According to at least one exemplary embodiment, at least some of the first partial regions have different vertical heights, so that an adaptation of the height distribution of the contacts to the predetermined geometrically non-planar contour profile is realized exclusively by the first partial regions of the contacts. Alternatively or in addition, it is also possible for some of the second partial regions to have different vertical heights, so that an adaptation of the height distribution of the contacts to the predetermined geometrically non-planar contour profile is realized exclusively by the second partial regions of the contacts or by both the first and the second partial regions of the contacts.

According to at least one embodiment of the component, the contacts are assigned to a first group of contacts and a second group of contacts, wherein the contacts of the first group differ from the contacts of the second group with respect to their material, for example, with respect to their ductility or their melting point. In particular, the contacts of the first group are arranged at the edge of the contacts of the second group. The contacts of the second group are thus arranged for instance centrally to the contacts of the first group. In lateral directions, the contacts of the second group may be surrounded by the contacts of the first group. For example, the contacts of the first group have a higher ductility and/or lower melting point compared to the contacts of the second group, or vice versa.

The diameters of the contacts can be formed such that a cross-section of the contacts varies, in particular varies monotonously from a central area to a peripheral area or to all peripheral areas of the component. The contacts of the first group and the contacts of the second group may have different cross-sections. It is possible that the contacts of the same group have the same cross-section. For example, the contacts of the first group have larger cross-sections than the contacts of the second group or vice versa. The vertical height of the contacts can be such that the vertical height of the contacts varies, in particular varies monotonously from a central area to a peripheral area or to all peripheral areas of the component. The contacts can also form a pattern that repeats itself several times along a lateral direction.

According to at least one embodiment of a device, it has a component described here, wherein the component has contacts comprising first and second partial regions. In particular, the first partial regions and the second partial regions of the respective contacts are mechanically and electrically connected to each other by a connecting material. The adaptation of the height distribution of the contacts of the device to the predetermined geometrically non-planar contour profile can be realized exclusively by the first partial regions or exclusively by the second partial regions or partially by the first partial regions and partially by the second partial regions of the contacts. The device may comprise a component which is formed as a semiconductor structure having a contact structure containing the first partial regions of the contacts of the device. Furthermore, the device may have a further component which is formed for instance as a connection structure or as a driver element, wherein the further component has a contact structure which contains the second partial regions of the contacts of the device. The device can thus have one component described here and a further component, wherein the contact structures of the components are connected to each other by a connecting material.

In particular, the device may be formed as a light-emitting device having a plurality of light dots. The light dots of the device can be defined by the subregions of the semiconductor body. In particular, the light dots and/or the groups of light dots can be electronically activated individually. The device or the component of the device is formed in particular as an LED light source for a headlamp, for example, for a motor vehicle headlamp.

According to at least one method for producing a component described here, whose contacts in each case have a one-piece formed section, the contacts are formed by lithography and by deposition. The one-piece formed section may also be part of a spacer layer. The one-piece formed sections of different contacts, which are formed in a common deposition process, can be of equivalent construction, comprise for instance the same material and have the same vertical or different vertical heights. It is possible for the different contacts or for different sections of the different contacts to be formed in different deposition processes. For example, the contacts of a first group are generated at least partially during a first deposition process and the contacts of a second group are generated at least partially during a second deposition process which differs from the first deposition process.

In accordance with at least one embodiment of a method for producing a component, the contacts of the first group and the contacts of the second group are at least partially formed in a common deposition process. The contacts of the first group may have one-piece formed first sections. The contacts of the second group may have one-piece formed second sections. The first and second sections may be formed in a common deposition process in such a way that, in a plan view, the first sections are formed within the associated openings of an insulating layer. The second sections can be formed to completely fill the associated openings of the insulating layer and, in a plan view, have a larger cross-section than the associated openings, so that compared to the first sections the second sections have elevated regions in the vertical direction. In particular, the elevated regions of the contacts have a vertical height which corresponds to the vertical thickness of the insulating layer or is essentially identical to the vertical thickness of the insulating layer. Thus, equivalent and one-piece formed sections having different vertical heights can be produced in a common forming process.

The method described above is particularly suitable for the production of a component described above or of a device described above. The features described in connection with the component or with the device can therefore also be used for the method and vice versa.

BRIEF DESCRIPTION OF THE DRAWINGS

Further advantages, preferred exemplary embodiments and further developments of the component or of the device as well as of the method will become apparent from the exemplary embodiments explained in the following in connection with FIGS. 1 to 9.

FIG. 1C shows an exemplary embodiment of a device in a schematic sectional view;

FIG. 2A shows another exemplary embodiment of a component in a schematic sectional view;

Figure 1A:
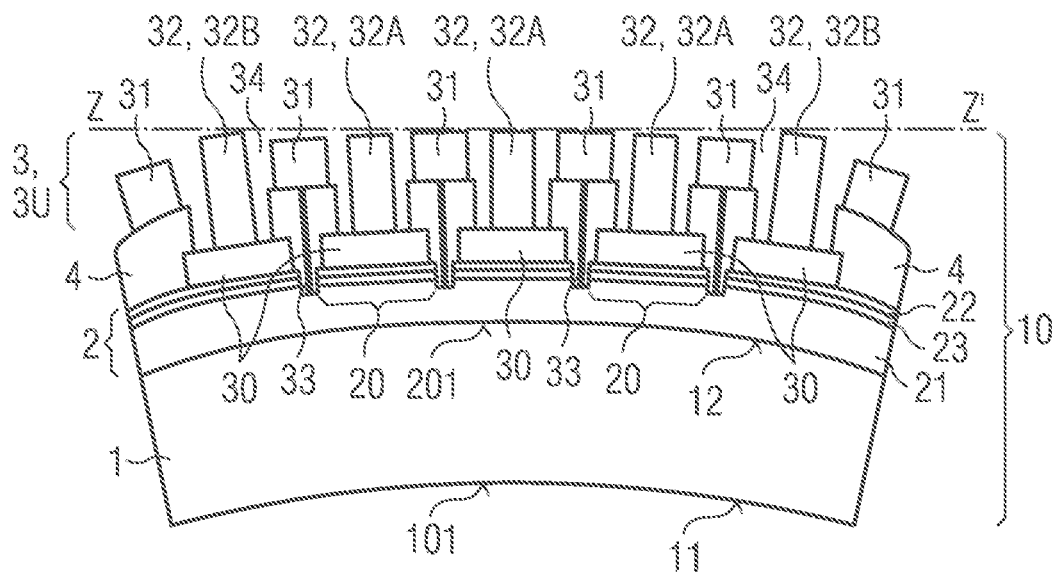
FIG. 1A shows an exemplary embodiment of a component in a schematic sectional view.

Identical, equivalent or equivalently acting elements are indicated with the same reference numerals in the figures. The figures are schematic illustrations and thus not necessarily true to scale. Comparatively small elements and particularly layer thicknesses can rather be illustrated exaggeratedly large for the purpose of better clarification.

DETAILED DESCRIPTION OF ILLUSTRATIVE EMBODIMENTS

Figure 1B:
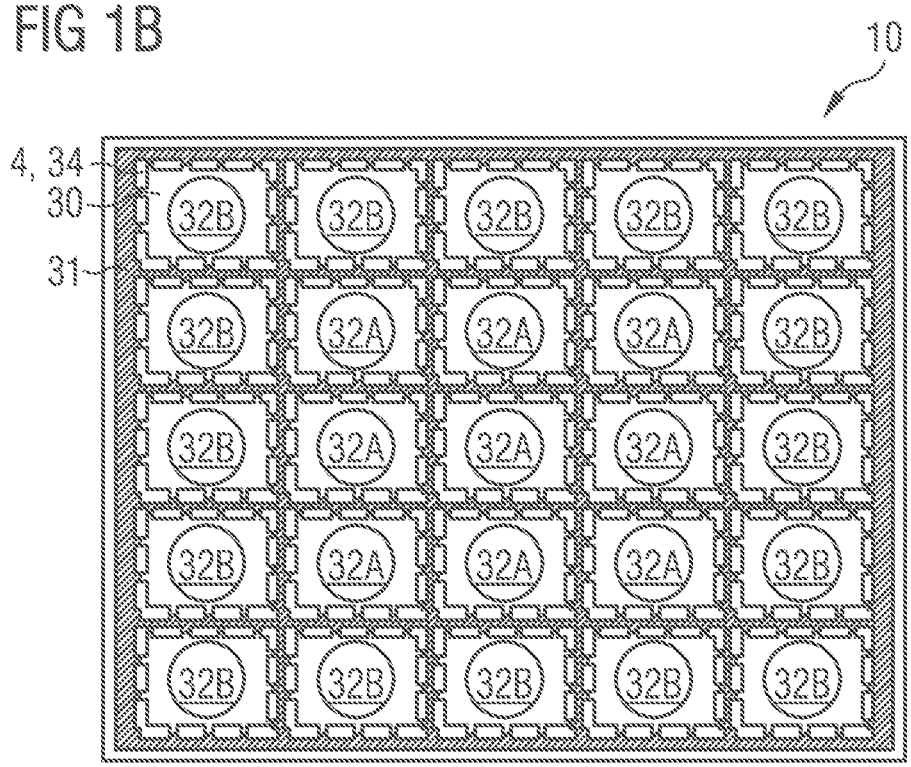
FIG. 1B shows a schematic representation of an exemplary embodiment for a component in a plan view.

An exemplary embodiment of a component 10 is shown schematically in FIG. 1A in a sectional view. In FIG. 1B, the component 10 as shown in FIG. 1A is shown schematically in a plan view of a connecting surface ZZ'. The component 10 has a carrier 1 and a semiconductor body 2 arranged on the carrier. The carrier 1 can be a growth substrate on which the semiconductor body 2 is grown epitaxially in layers. However, the carrier 1 may be different from a growth substrate or from a grinded growth substrate. For example, the carrier 1 is a silicon or sapphire substrate. The component 10 has a contact structure 3 or 3U on a surface of the semiconductor body 2 facing away from the carrier 1. Connection layers 30 are arranged between the contact structure 3 and the semiconductor body 2. The connection layers 30 are especially laterally spaced apart. In particular, the connection layers 30 define a plurality of pixels formed by subregions 20 of the semiconductor body 2. In particular, the connection layers 30 contain silver. Alternatively, the connection layers 30 may contain aluminum, rhodium or a transparent electrically conductive oxide such as indium tin oxide (ITO). The component 10 is for instance a semiconductor structure. In particular, the component 10 is free of a growth substrate.

The semiconductor body 2 comprises a first semiconductor layer 21, a second semiconductor layer 22 and an active layer 23 disposed between the first and second semiconductor layers. The first semiconductor layer 21 and the second semiconductor layer 22 are especially n- or p-conducting and can be n- or p-doped. The first semiconductor layer 21 is preferably n-conductive. The active layer 23 is especially configured for generating electromagnetic radiation. Preferably, the semiconductor body 2 comprises or consists of a III/V or II/VI semiconductor material.

The semiconductor body 2 can be structured into a plurality of subregions 20. In particular, a plurality of separation trenches are generated throughout both the second semiconductor layer 22 and the active layer 23 into the first semiconductor layer 21, such that the subregions 20 are laterally spaced from each other by the separation trenches. The first semiconductor layer 21 can be contiguous and coherent and thus free of openings. The subregions 20 in each case are thus arranged on the first semiconductor layer 21. Alternatively, it is possible for the subregions 20 to be defined solely by the connection layers 30 spaced apart from each other, wherein the connection layers 30 are configured for electrically contacting the common semiconductor layer 21 of the subregions 20. The common semiconductor layer 21 may have a lower electrical transverse conductivity than the second semiconductor layer 22, wherein a distance between adjacent connection layers 30 is preferably chosen so large that in each case the subregions 20 can be electrically activated exclusively by their associated overlapping connection layers 30 and not by adjacent connection layers 30. As a further alternative, the subregions 20 may be formed such that each of the subregions 20 comprises a separate first semiconductor layer 21, a separate second semiconductor layer 22 and a separate active layer 23 arranged between the semiconductor layers.

The subregions 20, for example, are formed as separately controllable light dots or as separately controllable pixels of the component 10, which can be controlled individually or in groups. The component 10 is in particular an LED light source. The component 10 may have more than 20, more than 50, more than 100 or more than 1000 such subregions 20. For example, the number of subregions is 64, 256 or 1024. The component has a lateral length or width that can be at least 1 mm, 2 mm or at least 4 mm. The subregions 20 are electrically connected to the contact structure 3 via the connection layers 30. Via the contact structure 3, the subregions 20 can be activated individually or in groups.

As shown in FIG. 1A, the semiconductor body 2 has a curvature along its main lateral extension surface 201. In particular, the curvature of the semiconductor body 2 is due to mechanical or thermomechanical tensions in the component 10. In particular, the semiconductor body 2 directly adjoins the carrier 1. The carrier 1 has a first main surface 11 facing away from the semiconductor body 2 and a second main surface 12 facing towards the semiconductor body 2. Both the first main surface 11 and the second main surface 12 are curved. In particular, the second main surface 12 of the carrier and the main extension surface 201 of the semiconductor body 2 have the same curvature or the same radius of curvature. The component 10 has a radiation passage surface 101, wherein the radiation passage surface 101 is formed by the first main surface 11 of the carrier 1. In particular, the carrier 1 is radiation-transmissive. The radiation passage surface 101 serves in particular as the radiation entry surface of the component 10. The carrier 1 is formed in particular to be electrically insulating.

The contact structure 3 has a contact layer 31 which is particularly contiguous and has several openings. The contact layer 31 may contain a metal such as Ag or Au or Cu or Zn. By means of through-vias 33 extending vertically from the contact layer 31 throughout an insulating layer 4 to the first semiconductor layer 21, the contact layer 31 can be electrically conductively connected to the first semiconductor layer 21. The insulating layer 4 is thus arranged between the contact layer 31 and the semiconductor body 2, wherein the insulating layer 4 extends regionally throughout both the second semiconductor layer 22 and the active layer 23 into the first semiconductor layer 21. The insulating layer 4 thus fills the openings between the subregions 20. If the openings are formed as separating trenches, the subregions 20 may be electrically insulated from each other and from the through-vias 33 by the insulating layer 4. Deviating from FIG. 1A, where the through-vias 33 are arranged for instance centrally between two connection layers 30, i.e., between two possible pixels, the through-vias 30 can be arranged at an edge area of a connection layer 30, i.e., at an edge area of a pixel.

The contact structure 3 has a plurality of contacts 32. The contacts 32 are formed for electrically contacting the subregions 20, in particular the second semiconductor layers 22 of the subregions, and extend in the vertical direction throughout the common openings of the contact layer 31 and the insulating layer 4 to the connection layers 30. For example, the contacts 32 each comprise a metal such as Ag or Au or Cu or Zn. The connection layers 30 in particular adjoin the second semiconductor layers 22 of the subregions 20. In particular, the connection layers 30 are not part of the contact structure and/or do not contribute to the adjustment of the height distribution of the contacts 32. In particular, the connection layers 30 have the same vertical height. Via the contacts 32 and the contact layer 31 as well as the through-vias 33, the semiconductor body 2 comprising the subregions 20 can be electrically externally connected, i.e., to an external voltage source. The contacts 32 or the connection layers 30 are especially laterally spaced from each other, so that the subregions 20 can be individually activated. It is also possible for the connection layers 30 to be in electrical contact in groups, so that the subregions 20 can be electronically controlled in groups.

The component 10 has an exposed mounting surface ZZ', wherein the exposed mounting surface ZZ' of the component 10 is defined by exposed ends of the contacts 32. Due to the curvature of the semiconductor body 2 and/or of the carrier 1, the component 10 may have a curved mounting surface that deviates from an ideal flat connection surface. In order to compensate for the curvature of the semiconductor body 2 or of the carrier 1 and to achieve a mounting surface ZZ' that is as flat as possible, the contacts 32 are formed with regard to their different heights and their positions in such a way that a height distribution of the contacts 32 is adapted to the curvature of the semiconductor body 2.

In FIG. 1A, the contacts 32 are divided into at least two groups of contacts 32. A first group contains contacts 32 comprising a first section 32A of height A. A second group contains contacts 32 comprising a second section 32B. The contacts 32 comprising the second sections 32B have a greater height than the contacts 32 comprising the first sections 32A. In each case, the sections 32A and 32B can be formed as one piece. The first sections 32A may have the same vertical heights and be formed in a common process step. The second sections 32B can be produced in a common process step and have the same vertical heights. In particular, the first sections 32A and the second sections 32B are formed in different process steps, so that the height difference and the material composition of the sections 32A and 32B can be freely selected. By stacking a section 32A on another section 32B, an additional height level or contact height can be achieved. The adaptation of the height distribution of the contacts 32 to the curvature of the semiconductor body 2 can be realized exclusively or partially by the first sections 32A and the second sections 32B. Deviating from FIG. 1A, the contacts 32 can be divided into more than two groups of the same contacts 32.

FIG. 1A shows the mounting surface ZZ' of the component 10, which is schematically represented by a dashed line, and is flat. In particular, an average distance from the mounting surface ZZ' to a connecting surface, which is for instance an ideal flat plane or a surface with the predetermined geometrically non-planar contour profile, may be less than 10 µm, for instance less than 5 µm or less than 3 µm per mm of component length. This ensures that each of the contacts 32 can be reliably electrically and mechanically connected to one of the external contact points. As shown in FIG. 1A, compared to the contacts 32, the contact layer 31 can have a greater distance to an ideal connection surface in regions. However, this is less critical, since the contact layer 31 is formed in a contiguous manner, so that a reliable electrical or mechanical connection is already achieved if other partial regions of the contact layer 31 have a reduced distance to the ideal connection surface. If the component 10 is mechanically and electrically connected to a connection structure by a connecting layer, for example, the connecting layer often has an increased layer thickness towards the edge due to its material distribution. Edge-side partial regions of the contact layer 31 can therefore have a greater distance to the ideal connection surface than centrally arranged partial regions of the contact layer 31. Deviating from FIG. 1A and analogous to the contacts 32, the contact layer 31 can also be formed in such a way that it is adapted to the predetermined geometrically non-planar contour profile, for instance to the curvature of the semiconductor body 2.

According to FIG. 1A, the contact layer 31 is assigned to a first electrical polarity of the component 10, while the contacts 32 are assigned to a second electrical polarity of the component 10. The contacts 32 are each arranged in a common opening of the contact layer 31 and of the insulating layer 4. In lateral directions, intermediate areas 34 are formed between the contact layer 31 and the contacts 32. These intermediate areas 34 can be filled with an electrically insulating filler which is not shown in FIG. 1A.

FIG. 1B shows a component 10 in a plan view. The contact layer 31 is contiguous and has a grid structure having openings, wherein the contacts 32 extend throughout the openings of the contact layer 31. In particular, the contacts 32 are each assigned to one of the subregions 20. The contacts 32 are assigned to two groups of contacts, wherein the first group includes the contacts 32 comprising the first sections 32A and the second group includes the contacts 32B. The contacts 32 of the first group are arranged centrally and next to each other, while the contacts 32 of the second group are arranged at the edge and enclose the contacts 32 of the first group on all sides.

In FIG. 1B, intermediate areas 34 or fillers 34 and/or the insulating layer 4 between the contact layer 31 and the contacts 32 are schematically indicated by dotted lines. All contacts 32 have a cross-section of essentially the same size. In contrast to this, it is possible for the contacts 32 to vary with regard to their diameters from a central area towards an edge area of the component 10. For example, the contacts 32 comprising the second sections 32B may have a larger cross-section than the contacts 32 comprising the first sections 32A or vice versa. In a plan view, the first sections 32A and the second sections 32B or the contacts 32 are each arranged on a connection layer 30. The contacts 32 comprising the sections 32A and the contacts 32 comprising the sections 32B can be made of the same material or of different materials. For example, the contacts 32 comprising the sections 32B may have a material or may be made of a material which has a higher ductility and/or lower melting point than a material of the contacts 32 comprising the sections 32A or vice versa.

FIG. 1C shows a device 100. The device 100 has a component 10 as shown in FIG. 1A. The component 10 is mechanically and electrically connected to a further component 90 on the mounting surface ZZ', in particular by a connecting layer, for instance by a solder layer. The further component 90 can be formed as a connection structure or as a driver element. The further component 90 has a connection plate 9 having a substantially flat front side 91 and a contact structure 3D arranged on it, wherein the contact structure 3D has a construction which corresponds to that of the contact layer 3U of the component 10 formed as a semiconductor structure. The contact structure 3D of the further component 90 has a contact layer 31Z, contacts 32Z and a mounting surface ZZ'. The ideal connecting surface between the components 10 and 90 is defined for instance by entirely overlapping areas of the mounting surfaces ZZ'. In each case, the component 10 formed as a semiconductor structure and the component 90 formed as a connection structure or driver element have a flat mounting surface ZZ', so that the realization of a safe and reliable mechanical and electrical connection between the components 10 and 90 is simplified. It can be achieved that each of the contacts 32 comprising the sections 32A or 32B is connected to a corresponding section 32Z of the contact structure 3D of the other component 90 in a reliable manner.

The device 100 shown in FIG. 1C thus has a contact structure 3 which is formed from the contact structures 3U and 3D of the components 10 and 90. The contact structure 3 of the device 100 has a plurality of contacts 32, each of which is formed in a multiple-piece manner. In particular, each of the contacts 32 has a first partial region 321 and a second partial region 322, wherein the first partial region 321 and the second partial region 322 of the respective contacts 32 are mechanically and electrically connected to one another, for instance by means of a connecting material. The first partial region 321 comprises the first section 32A or the second section 32B and is part of the component 10 formed as a semiconductor structure. The second partial region 322 of the respective contact 32 of the contact structure 3 of the device 100 has a section 32Z and is part of the component 90. After connecting the component 10 to the component 90, the device 100 thus still has a contact structure 3 containing a plurality of contacts 32 having different vertical heights. In FIG. 1C, the adjustment of the height distribution of the contacts 32 of the contact structure 3 of the device 100 to the predetermined geometrically non-planar contour profile is realized exclusively by the first partial regions 321 of the contacts 32. Deviating from FIG. 1C, it is possible that the adjustment of the height distribution of the contacts 32 is realized exclusively by the second partial regions 322 or partly by the second partial regions 322 and partly by the first partial regions 321.

The connection plate shown in FIG. 1C can be formed as a driver element for the subregions 20 of the semiconductor body 2. For example, it is possible that a plurality of transistors and/or integrated circuits are integrated in the connection plate 9, so that the subregions 20 are electrically connected to the driver element, in particular via the contacts 32, and can be electronically activated individually via the driver element.

FIG. 2A shows a component 90 having a contact structure 3 or 3D. The component 90 has a connection plate 9 or a driver element 9 comprising a plurality of transistors and/or integrated circuits, wherein the contacts 32 of the contact structure 3D are electrically connected to the connection plate 9 or to the driver element and can be electronically activated individually via the driver element. Structurally, the 3D contact structure shown in FIG. 2A essentially corresponds to the contact structure 3U shown in FIG. 1A. In FIG. 1A, the contacts 32 are formed on a curved semiconductor body 2 and have exposed ends which face away from the semiconductor body 2 and define a flat mounting surface ZZ' of the component 10. In contrast, the contacts 32 of the contact structure 3D shown in FIG. 2A are formed on a substantially flat front side 91 of the connection plate 9, wherein the contacts 32 of the contact structure 3D have exposed ends which define a mounting surface ZZ' of the component 90 which is non-planar and in particular defines the predetermined geometrically non-planar contour profile.

Figure 2B:
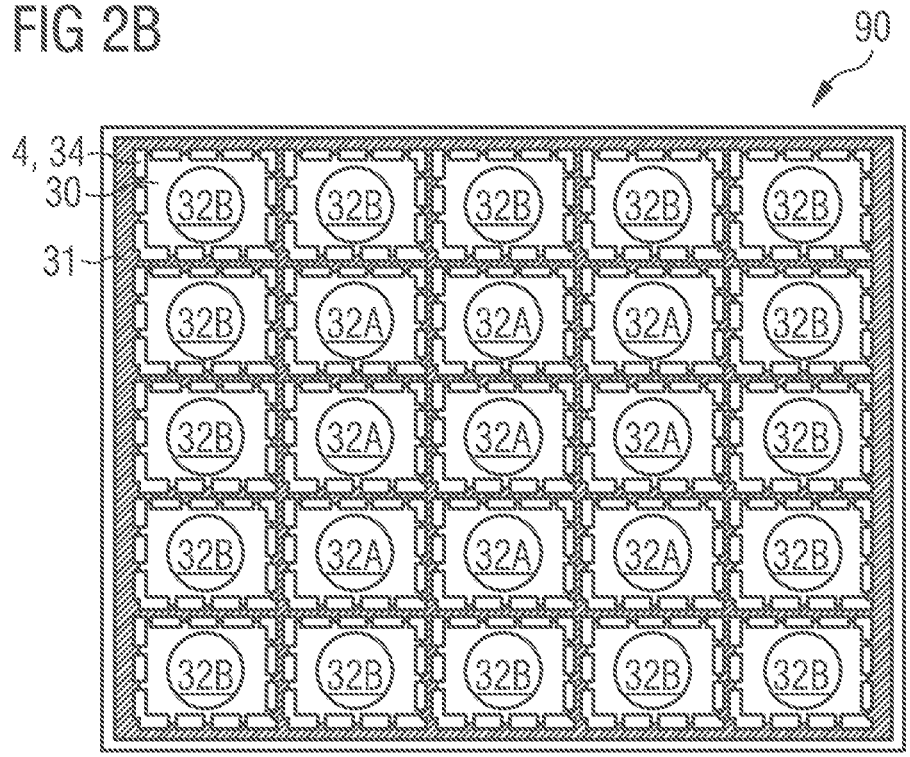
FIG. 2B shows a schematic representation of another exemplary embodiment of a component in a plan view.

FIG. 2B shows the component 90 in a plan view having the contact structure 3D which comprises the contact layer 31 and the contacts 32 having the sections 32A and 32B. The contact structure 3D of the component 90 essentially corresponds to the contact structure 3 of the component 10, which is formed as a semiconductor structure, as shown in FIG. 1B.

Figure 2C:
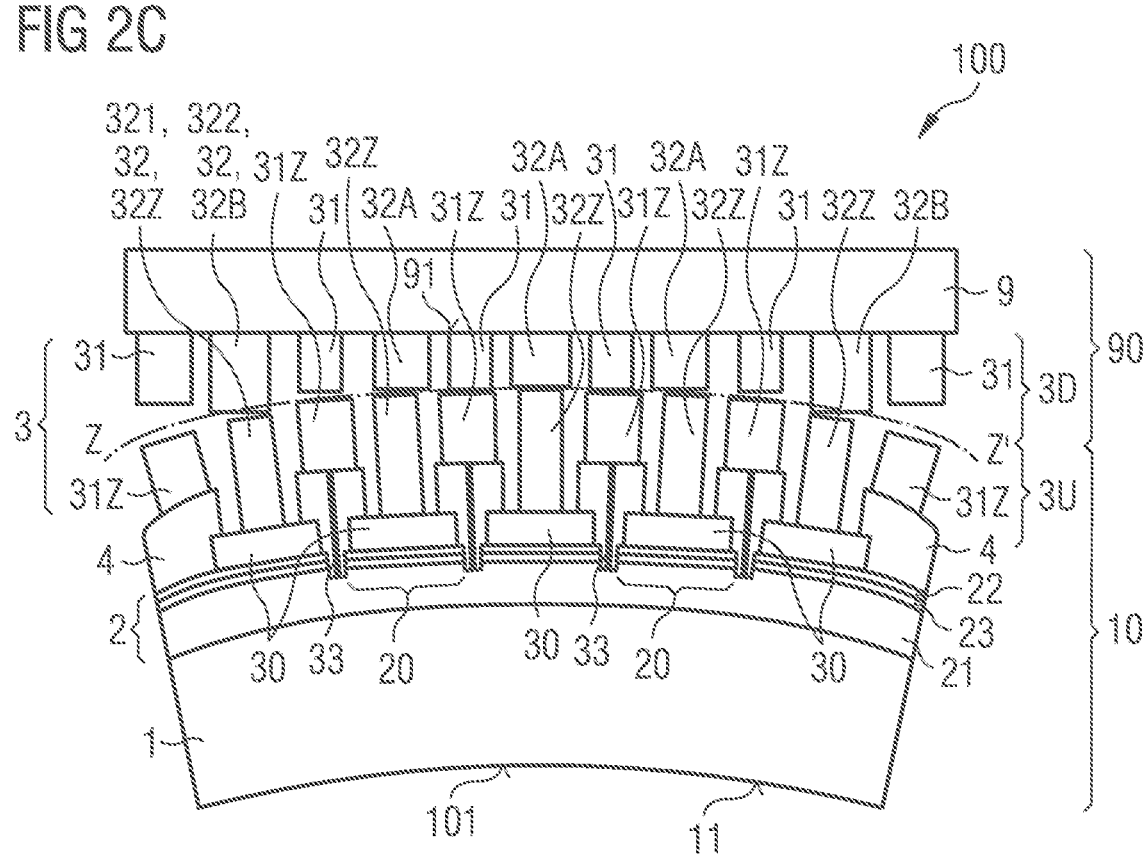
FIG. 2C shows an exemplary embodiment of a further device in a schematic sectional view.

The device 100 shown in FIG. 2C essentially corresponds to the exemplary embodiment of the device 100 shown in FIG. 1C. In contrast, the device 100 in FIG. 2C comprises the component 90 shown in FIG. 2A, which is formed as a connection structure or as a driver element. In addition, the height distribution of the contacts 32 of the contact structure 3 can be adapted to the predetermined geometrically non-planar contour profile exclusively by the second partial regions 322 of the contacts 32. The first partial regions 321 of the contacts 32 can have the same vertical heights, wherein the first partial regions 321 in each case are formed in particular from a one-piece section 32Z. The one-piece formed sections 32Z in FIG. 2C or in FIG. 1C may have the same vertical height and can be produced in a common process step.

In FIG. 2C, both the component 90 formed as a connection structure and the component 10 formed as a semiconductor structure have a curved mounting surface ZZ', wherein the curved mounting surface ZZ' resembles the curvature of the semiconductor body or of the carrier 1. The ideal connecting surface between the components 10 and 90 is defined by entirely overlapping areas of the mounting surfaces ZZ'. The contact structure 3 of the device 100 further has individual contacts 32 which at least partially have different vertical heights, wherein the contacts 32 are formed with respect to their different heights and their positions in such a way that a height distribution of the contacts 32 is adapted to a predetermined geometrically non-planar contour profile, namely to the curvature of the semiconductor body 2 and/or of the carrier 1.

Figure 3A:
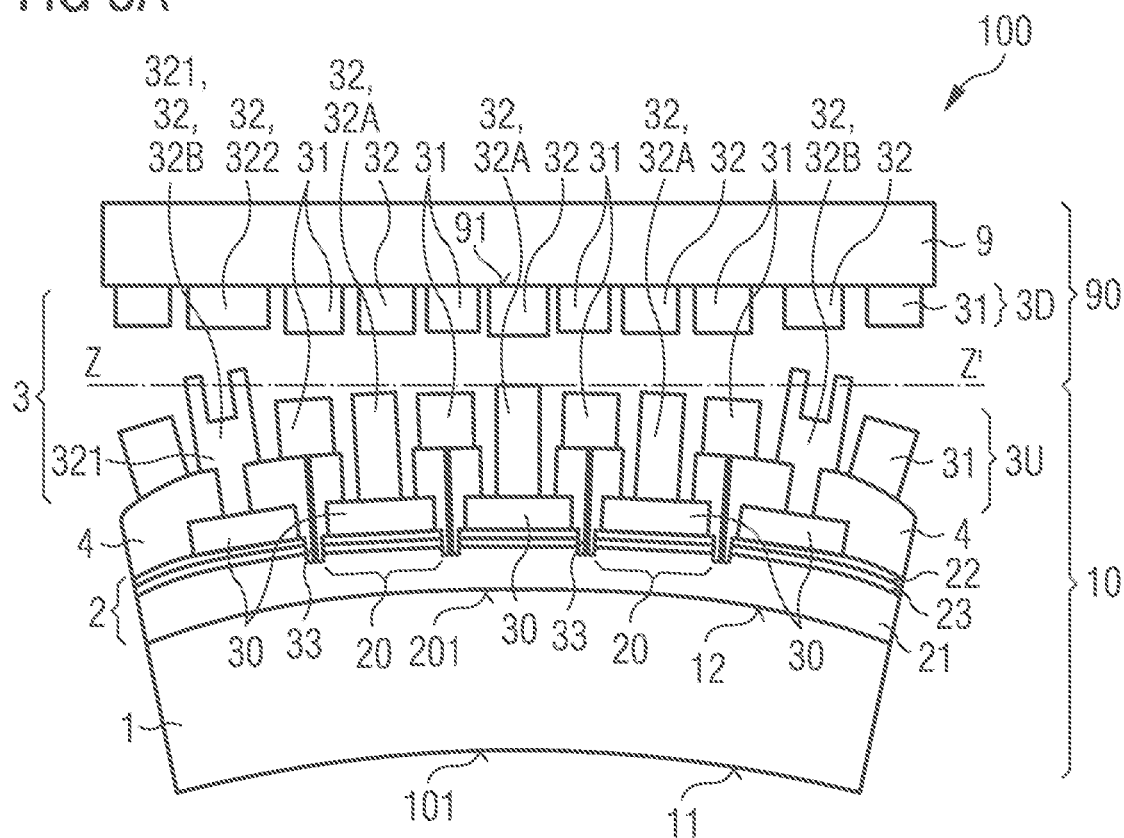
FIG. 3A shows a schematic representation of a further exemplary embodiment of a component or of a device in a schematic sectional view.

The device 100 shown in FIG. 3A essentially corresponds to the embodiment of a device shown in FIG. 1C. In contrast, the sections 32B of the component 10, which have greater vertical heights than the sections 32A, are formed to completely fill the associated openings of the insulating layer 4 and, in a plan view, have a larger cross-section than the associated openings of the insulating layer 4 so that the sections 32B project laterally beyond the associated openings of the insulating layer 4. The sections 32A and 32B can in each case be one-piece and preferably are produced in a common method step. In particular, the sections 32A and 32B are formed during a common deposition process, wherein the sections 32B differ from the sections 32A by a vertical height which is substantially given by the depth of the associated openings of the insulating layer 4. The sections 32B may each have an opening that resembles the contour profile of the associated opening of the insulating layer 4. The further component 90 shown in FIG. 3A corresponds to the component 90 described in FIG. 1C.

Figure 3B:
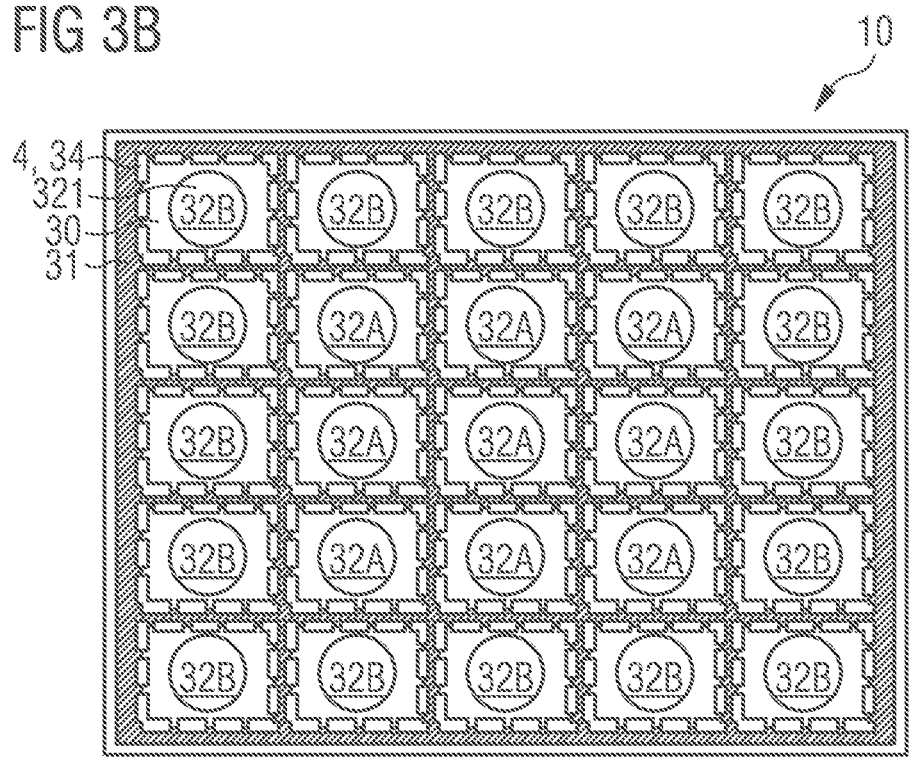
FIG. 3B shows a schematic representation of a further exemplary embodiment of a component in a plan view.

FIG. 3B shows the component 10 described in FIG. 3A in a plan view. The contact structure 3U of the component 10 shown in FIG. 3B corresponds to the contact structure shown in FIG. 1B.

Figure 4A:
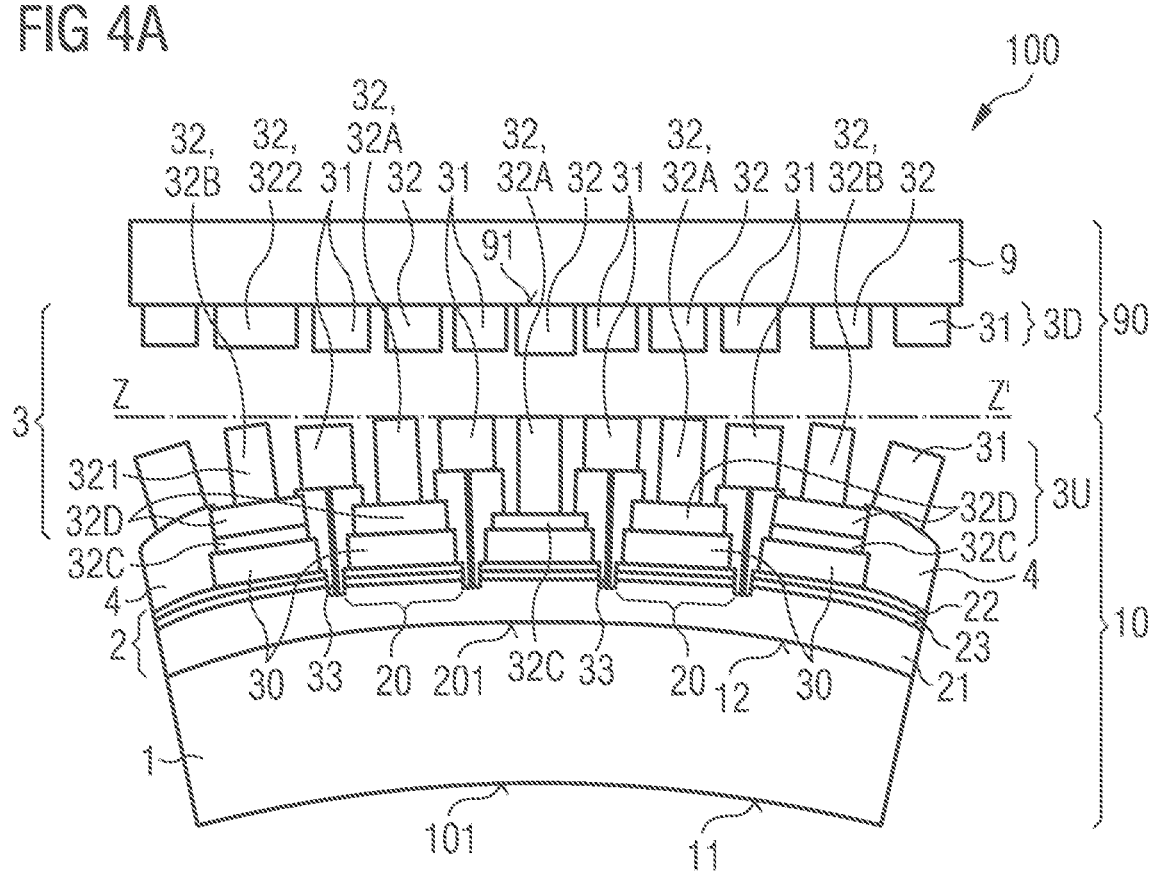
FIG. 4A shows a schematic representation of another exemplary embodiment of a component or of a device in a plan view.

The device 100 comprising the component 10 shown in FIG. 4A essentially corresponds to the exemplary embodiment of the device 100 shown in FIG. 3A. In contrast to this, the contact structure 3U of the component 10 has a plurality of spacer layers 32C and 32D having vertical heights C and D, respectively. The sections 32A and 32B may have the same vertical heights and may be formed in a common process step. The adjustment of the height distribution of the contacts 32 of the contact structure 3U is realized for instance exclusively by different numbers of the spacer layers of the respective contacts 32. Alternatively, the sections 32A and 32B may have different vertical heights.

In FIG. 4A, a centrally arranged contact 32 has only a single spacer layer 32C with a vertical height C. The further contacts 32, which laterally surround the centrally arranged contact 32, each have only one further spacer layer 32D with the vertical height D, wherein the vertical height D is greater than the vertical height C. In FIG. 4A, the contacts 32 arranged at the edge have both the contact layer 32C with vertical height C and the spacer layer 32D with vertical height D. The different contacts 32 can thus have different vertical heights, wherein the adaptation of the height distribution to a predetermined geometrically non-planar contour profile is realized exclusively or partially by the spacer layers 32C and/or 32D.

Figure 4B:
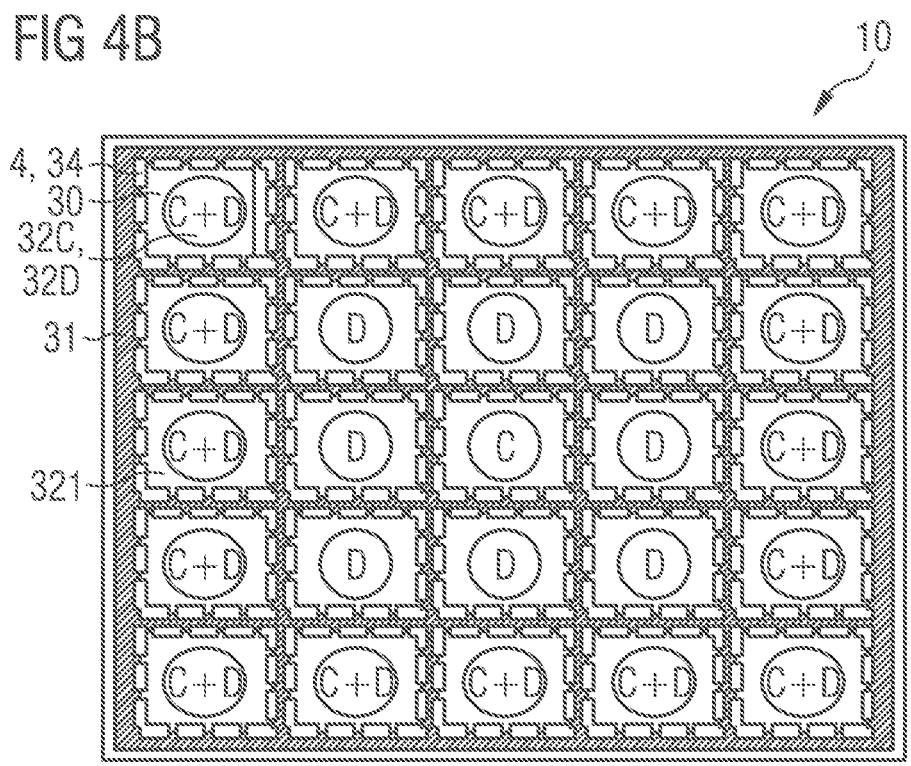
FIG. 4B shows a schematic representation of a further exemplary embodiment of a component in a plan view.

FIG. 4B shows the contact structure 3U of the component 10 described in FIG. 4A in a plan view. From a central area towards peripheral areas of the component 10, the first partial regions 321 of the contacts 32 have varying vertical heights, wherein the height of the contacts increases monotonously from the central area to any peripheral area of the component 10.

Figure 5A:
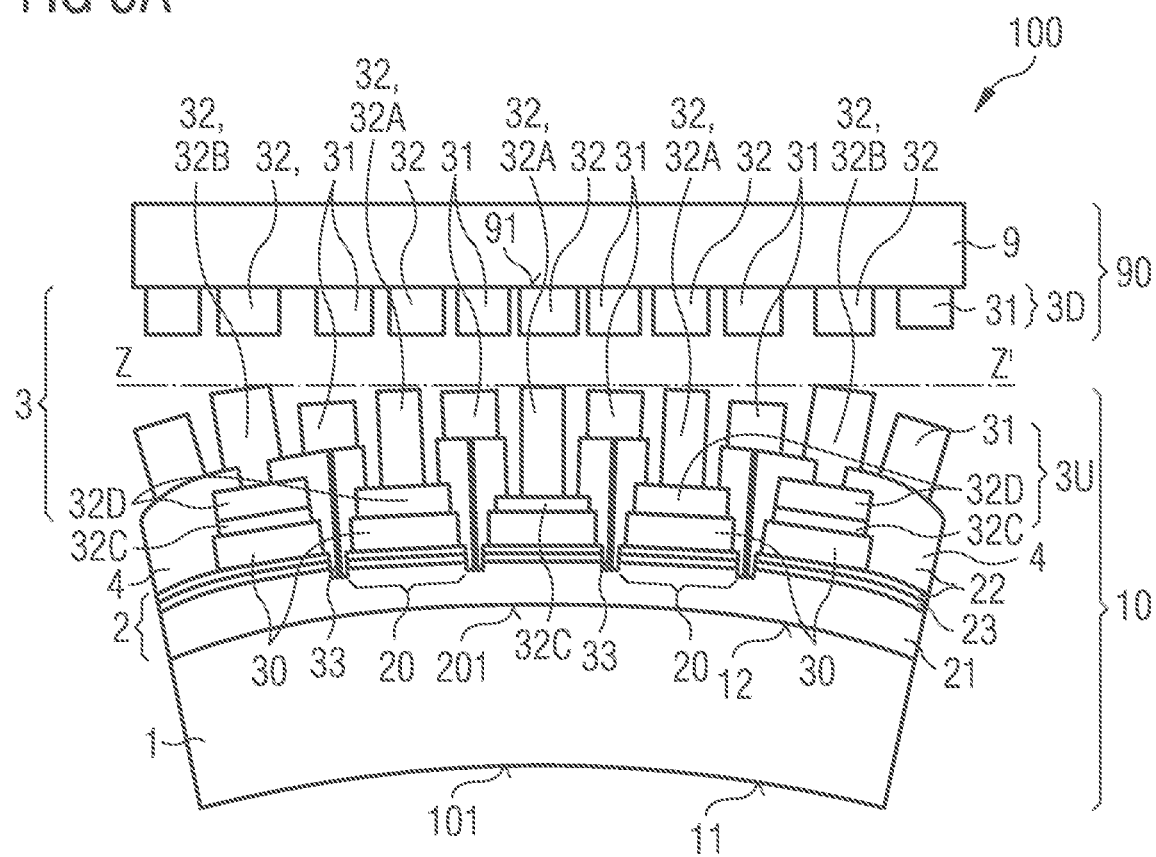
FIG. 5A shows a further exemplary embodiment of a component or of a device in a schematic sectional view.

The exemplary embodiment of a device 100 shown in FIG. 5A essentially corresponds to the exemplary embodiment of the device shown in FIG. 4A. In contrast, the sections 32B shown in FIG. 5A essentially correspond to the sections 32B shown in FIG. 3A. The sections, in particular the one-piece formed sections 32A and 32B can be formed in a common process step and still have different vertical heights.

Figure 5B:
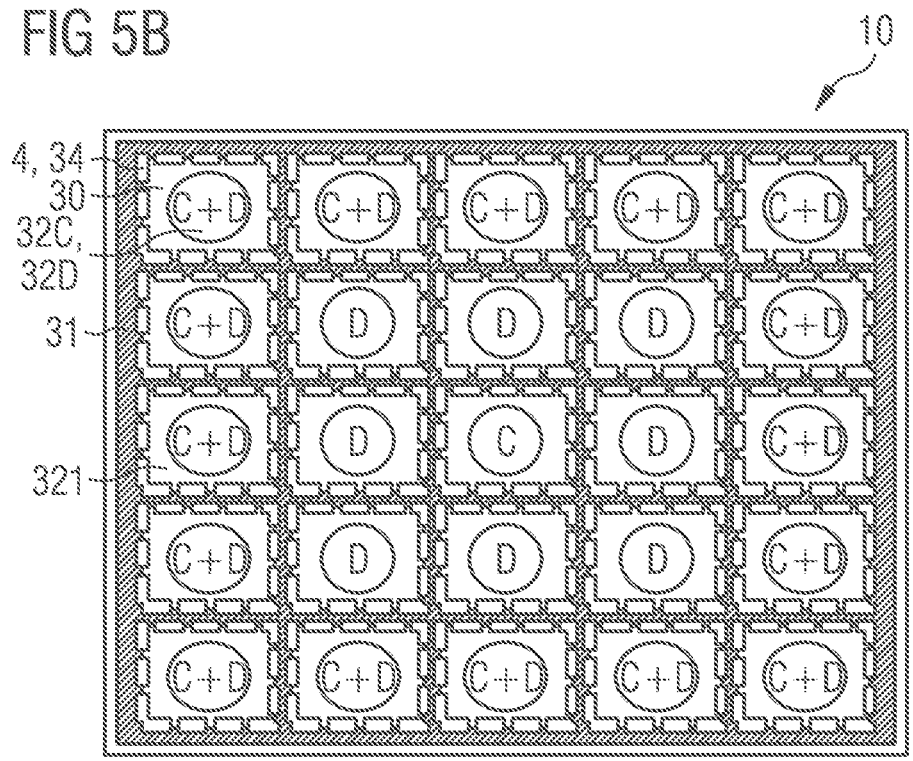
FIG. 5B shows a schematic representation of a further exemplary embodiment of a component in a plan view.

The contact structure 3U of the component 10 described in FIG. 5B is the contact structure 3U shown in FIG. 5A in a plan view and essentially corresponds to the contact structure 3U of the component 10 shown in FIG. 4B. Deviating from the patterns formed by the contacts 32 as shown in FIGS. 1B, 2B, 3B, 4B and 5B, the component 10 or 90 may also have other patterns. The component 10 or 90 can also have a local pattern as shown for instance in FIG. 1B, 2B, 3B, 4B or 5B which repeats itself several times along a lateral direction.

Figure 6:
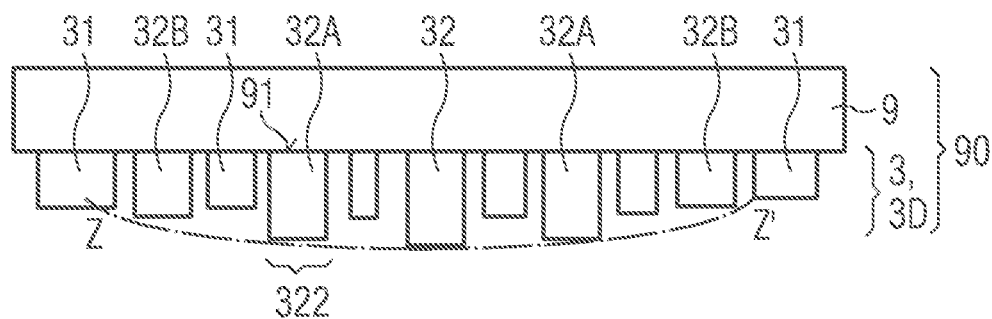
FIG. 6 shows an exemplary embodiment of a further component in a schematic sectional view.

The contact structure 3D of the component 90 shown in FIG. 6 essentially corresponds to the contact structure 3D of the component shown in FIG. 2A. In contrast to FIG. 2A, in which the component 90 has a concavely curved mounting surface ZZ', the contacts 32 of the contact structure 3D shown in FIG. 6 having the sections 32A and 32B are formed with respect to their heights and positions on the connection plate 9 having the flat front side 91 in such a way that the component 90, which is formed as a connection structure, has a convexly curved mounting surface ZZ'.

Figure 7:
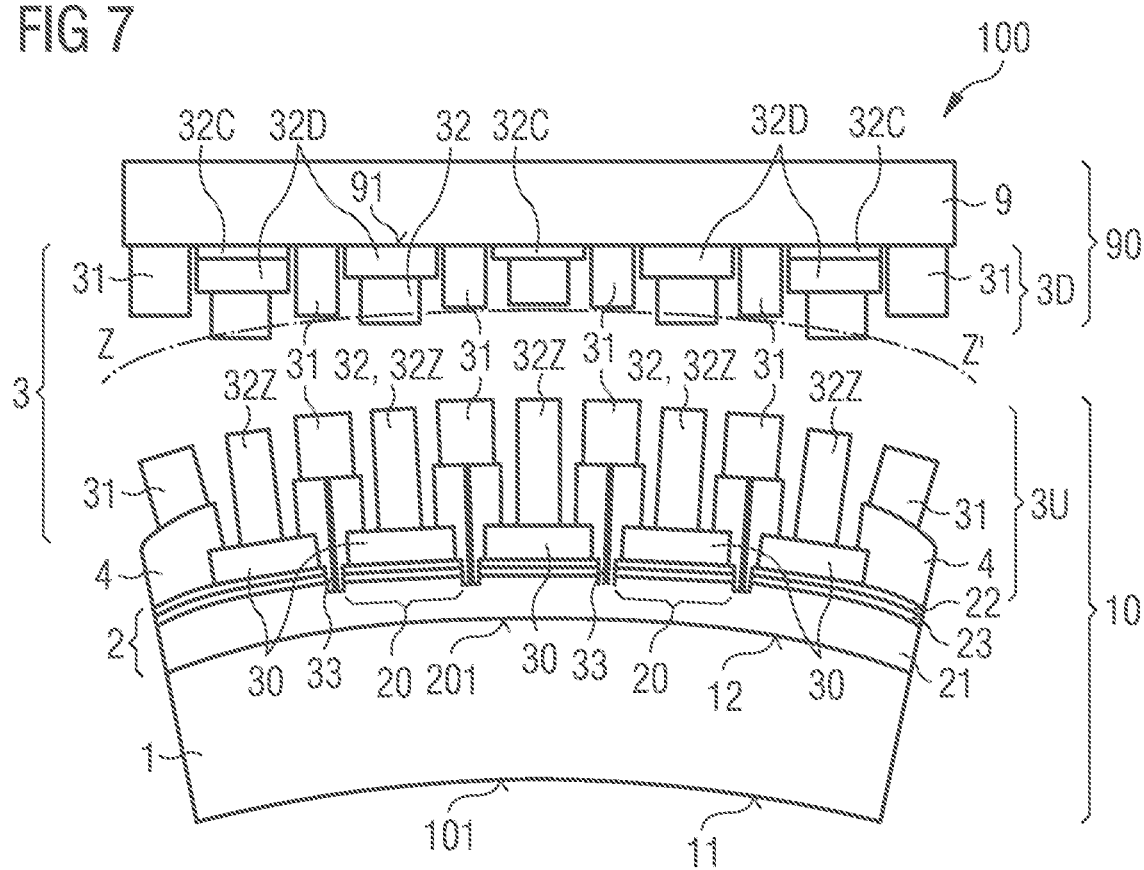
FIG. 7 shows another exemplary embodiment of a component or of a device in a schematic sectional view.

The exemplary embodiment of a device 100 shown in FIG. 7 is essentially identical to the device shown in FIG. 2C. In contrast, the component 90, which is formed as a connection structure in FIG. 7, has a contact structure 3D comprising a plurality of spacer layers 32C and 32D. In contrast to the contact structure described in FIG. 4A or 4B, the spacer layers 32C and 32D are not arranged on the side of the component 10 formed as a semiconductor structure, but on the side of the component 90 formed as a connection structure.

Figure 8:
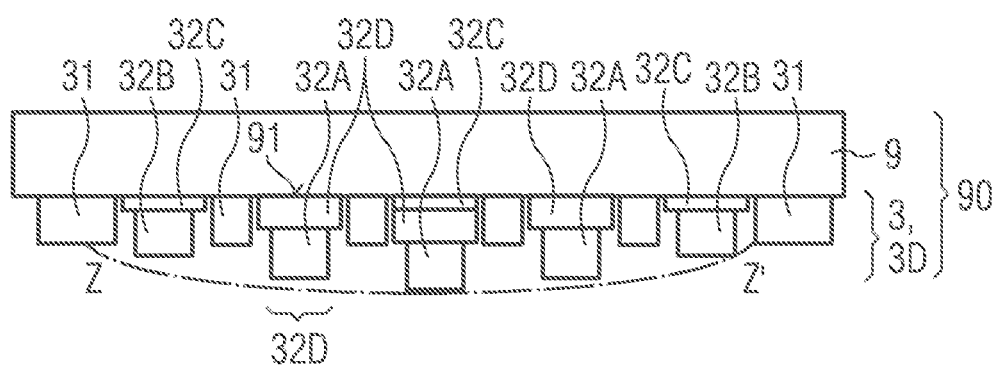
FIGS. 8 and 9 show further exemplary embodiments of a component in schematic sectional views.

The contact structure 3D of the component 90 shown in FIG. 8 essentially corresponds to the contact structure 3D shown in FIG. 6, but comprises a plurality of spacer layers 32C and 32D. In particular, the sections 32A and 32B are one-piece and have for instance the same vertical height.

Figure 9:
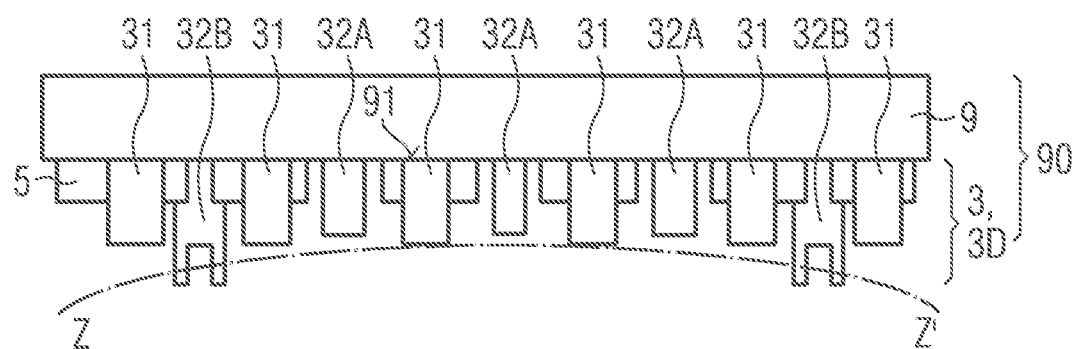

The contact structure 3D shown in FIG. 9 essentially corresponds to the contact structure 3D shown in FIG. 2A, but comprises an insulating layer 5 and the sections 32B having elevated regions, wherein the insulating layer 5 and the sections 32B of the contacts 32 are constructed and formed analogously to the insulating layer 4 and the sections 32B in FIG. 3A, respectively.

For the adaptation of a height distribution of the contacts to a predetermined geometrically non-planar contour profile, a coupling between the heights of the contacts of a contact structure and their lateral positions is suggested, wherein the contacts have different numbers of spacer layers and/or one-piece sections of different heights resulting in contacts having different heights.

The invention is not restricted to the exemplary embodiments by the description of the invention made with reference to exemplary embodiments. The invention rather comprises any novel feature and any combination of features, including in particular any combination of features in the claims, even if this feature or this combination is not itself explicitly indicated in the patent claims or exemplary embodiments.

The invention claimed is:

1. A component comprising:
  a contact structure comprising:
    a contiguous contact layer having a plurality of openings, the contiguous contact layer being assigned to a first electrical polarity of the component,
    a plurality of individual contacts at least in part having different vertical heights,
    wherein the contiguous contact layer has a grid structure comprising the openings and the contacts extend in the openings throughout the contiguous contact layer and thus throughout the openings of the contiguous contact layer,
    wherein the contacts are laterally spaced from each other and are assigned to a second electrical polarity of the component, and
    wherein the contacts are arranged with respect to their different heights and their positions such that a height distribution of the contacts is adapted to a predetermined geometrically non-planar contour profile.

2. The component according to claim 1, further comprising:
  a semiconductor body comprising a first semiconductor layer of a first carrier type, a second semiconductor layer of a second carrier type and an active layer arranged therebetween,
  wherein the second semiconductor layer and the active layer are structured into a plurality of laterally spaced subregions,
  wherein the contacts electrically contact the subregions, and wherein the semiconductor body has a curvature along a lateral main extension surface which defines the predetermined geometrically non-planar contour profile.

3. The component according to claim 2, wherein the semiconductor body is arranged on a substrate, wherein the first semiconductor layer is arranged in a vertical direction between the substrate and the subregions, and wherein the first semiconductor layer is contiguous.

4. The component according to claim 2, wherein the second semiconductor layer is disposed between the contact layer and the first semiconductor layer, wherein the contact structure has a plurality of through-vias extending from the contact layer throughout both the second semiconductor layer and the active layer to the first semiconductor layer.

5. The component according to claim 1, further comprising a driver element comprising a plurality of transistors and/or integrated circuits, wherein the contacts are electrically connected to the driver element, and wherein the contacts are electronically individually controllable via the driver element.

6. The component according to claim 1,
wherein the contacts have exposed ends,
wherein the exposed ends define a mounting surface of the component,
wherein an average distance from the mounting surface to a connecting surface is less than 10 microns, and
wherein the connecting surface is an ideal flat plane or a surface having the predetermined geometrically non-planar contour profile.

7. The component according to claim 1,
wherein the contacts are assigned to a first group of contacts and a second group of contacts,
wherein each contact of the first group has a one-piece formed first section,
wherein each contact of the second group has a one-piece formed second section,
wherein the first sections of different contacts of the first group are of equivalent construction and have a first vertical layer thickness,
wherein the second sections of different contacts of the second group are of equivalent construction and have a second vertical layer thickness, and
wherein the first vertical layer thickness is different from the second vertical layer thickness so that the contacts of the first group and the contacts of the second group have different vertical heights.

8. A component comprising:
a contact structure comprising:
a contiguous contact layer having a plurality of openings, the contiguous contact layer being assigned to a first electrical polarity of the component,
a plurality of individual contacts at least in part having different vertical heights,
wherein the contacts extend in the openings throughout the contiguous contact layer, are laterally spaced from each other and are assigned to a second electrical polarity of the component,
wherein the contacts are arranged with respect to their different heights and their positions such that a height distribution of the contacts is adapted to a predetermined geometrically non-planar contour profile,
wherein the contact structure comprises an insulating layer having a plurality of openings corresponding to the openings of the contact layer,
wherein each contact has a one-piece formed section,
wherein each one-piece formed section is regionally located in an associated opening of the insulating layer projects regionally beyond the insulating layer in a vertical direction,
wherein at least some of the one-piece formed sections have different vertical heights,
wherein the sections having lower vertical heights are formed such that, in a plan view, they are arranged within the associated openings of the insulating layer, and
wherein the sections having larger vertical heights are formed such that they completely fill the associated openings of the insulating layer and, in a plan view, have a larger cross-section than the associated openings of the insulating layer.

9. A method for producing the component according to claim 8, wherein the contacts are assigned to a first group and a second group, wherein the contacts of the first group have one-piece formed first sections, wherein the contacts of the second group have one-piece formed second sections, the method comprising:
forming the first and second sections in a common deposition process,
wherein, in a plan view, the first sections are formed within the associated openings of the insulating layer, and
wherein the second sections are formed to completely fill the associated openings of the insulating layer and, in a plan view, have a larger cross-section than the associated openings such that the second sections have elevated regions compared to the first sections.

10. The component according to claim 1, wherein at least some of the contacts have one or a plurality of spacer layers, wherein an adaptation of the height distribution of the contacts to a predetermined geometrically non-planar contour profile is realized by different numbers of the spacer layers of the respective contacts.

11. The component according to claim 1, wherein the contacts are assigned to a first group of contacts and a second group of contacts, and wherein the contacts of the first group differ from the contacts of the second group in terms of their material.

12. The component according to claim 1,
wherein the contacts are assigned to a first group of contacts and a second group of contacts,
wherein the contacts of the first group are arranged at an edge of the contacts of the second group,
wherein the contacts of the second group are arranged centrally with respect to the contacts of the first group, and
wherein the contacts of the first group and the contacts of the second group have different cross-sections.

13. The component according to claim 1, wherein the contacts have ends whose surfaces define the predetermined geometrically non-planar contour profile, and wherein first ends of the contacts define a planar surface while the other opposite ends of the contacts define a non-planar surface.

14. The component according to claim 1, further comprising:
a semiconductor body having a curvature along a main lateral extension surface defining the predetermined geometrically non-planar contour profile,
wherein the semiconductor body comprises a first semiconductor layer of a first carrier type, a second semiconductor layer of a second carrier type, and an active layer located therebetween, wherein the second semiconductor layer and the active layer are structured into a plurality of laterally spaced apart subregions, and wherein the contacts are configured for electrically contacting the subregions.

15. A method for producing the component according to claim 1, wherein each contact has at least one one-piece formed section, the method comprising:

forming the contacts by lithography and deposition techniques; and forming the one-piece formed sections of different contacts in a common deposition process so that they are of equivalent construction and have the same vertical heights.

16. A device comprising:

the component according to claim 1, wherein each contact is formed in a multiple-piece manner and has a first partial region and a second partial region, and wherein the first partial region and the second partial region of the respective contacts are mechanically and electrically connected to each other by a connecting material.

17. The device according to claim 16, wherein at least some of the first partial regions have different vertical heights so that an adaptation of the height distribution of the contacts to the predetermined geometrically non-planar contour profile is realized exclusively by the first partial regions of the contacts.

18. The device according to claim 16, wherein at least some of the second partial regions have different vertical heights so that an adaptation of the height distribution of the contacts to the predetermined geometrically non-planar contour profile is realized exclusively by the second partial regions of the contacts.

19. A device comprising:

a component comprising:

a contact structure comprising:

a contiguous contact layer having a plurality of openings, the contiguous contact layer being assigned to a first electrical polarity of the component, a plurality of individual contacts at least in part having different vertical heights, wherein the contacts extend in the openings throughout the contiguous contact layer are laterally spaced from each other and are assigned to a second electrical polarity of the component, wherein the contacts are arranged with respect to their different heights and their positions such that a height distribution of the contacts is adapted to a predetermined geometrically non-planar contour profile, wherein each contact is formed in a multiple-piece manner and has a first partial region and a second partial region, wherein the first partial region and the second partial region of the respective contacts are mechanically and electrically connected to each other by a connecting material, wherein at least some of the first partial regions of the contacts have different vertical heights, wherein at least some of the second partial regions of the contacts have different vertical heights, and wherein an adaptation of the height distribution of the contacts to the predetermined geometrically non-planar contour profile is realized partly by the first partial regions and partly by the second partial regions of the contacts.

20. A headlamp comprising:

the device according to claim 16, wherein the device is an LED light source.

* * * * *